United States Patent [19]

Weed et al.

[11] Patent Number: 5,143,818
[45] Date of Patent: Sep. 1, 1992

[54] BORATE COINITIATORS FOR PHOTOPOLYMERIZABLE COMPOSITIONS

[75] Inventors: Gregory C. Weed, Towanda, Pa.; Bruce M. Monroe, Wilmington, Del.

[73] Assignee: E. I. du Pont de Nemours and Company, Wilmington, Del.

[21] Appl. No.: 649,358

[22] Filed: Feb. 1, 1991

[51] Int. Cl.⁵ ................................................. G03C 1/73
[52] U.S. Cl. ..................................... 430/281; 430/914; 430/915; 430/919; 430/2; 430/325; 522/25; 522/15
[58] Field of Search ............... 430/281, 914, 915, 325, 430/2, 919; 522/25, 26, 15

[56] References Cited

U.S. PATENT DOCUMENTS

| | | | |
|---|---|---|---|
| 4,772,530 | 9/1988 | Gottschalk et al. | 430/914 |
| 4,859,572 | 8/1989 | Farid et al. | 430/915 |
| 4,950,581 | 8/1990 | Koike et al. | 430/915 |
| 4,971,891 | 11/1990 | Kawamura et al. | 522/25 |

OTHER PUBLICATIONS

*Aldrich Catalog*, Aldrich Chemical Company, Inc., 1990, pp. 623, 898, 899, "Ethyl Orange", Methyl Orange.

*Primary Examiner*—Marion E. McCamish
*Assistant Examiner*—C. D. RoDee

[57] ABSTRACT

This invention relates to initiator systems for photopolymerizable compositions. More particularly, this invention pertains to photopolymerizable compositions in which the initiator system comprises an anionic dye in combination with a borate anion coinitiator.

20 Claims, No Drawings

BORATE COINITIATORS FOR PHOTOPOLYMERIZABLE COMPOSITIONS

FIELD OF THE INVENTION

This invention relates to initiator systems for photopolymerizable compositions. More particularly, this invention pertains to photopolymerizable compositions in which the initiator system comprises an anionic dye in combination with a borate anion coinitiator.

The use of photoinitiator systems to initiate photopolymerization is well known When irradiated by actinic radiation, the photoinitiator system generates free radicals which initiate polymerization of the monomer or monomers The photoinitiator system may be a single compound which absorbs actinic radiation and forms the initiating radicals or it may consist of several different materials which undergo a complex series of reactions to produce radicals Added components, which do not absorb actinic radiation, but which increase the efficiency of the photoinitiator system, are known as coinitiators.

Many of the well-known photoinitiators or photoinitiator systems limit the applicability of photopolymerizable compositions because they are activated only by ultraviolet radiation. The availability of reliable, relatively inexpensive visible lasers which can be controlled by computer to expose the photopolymer directly, eliminating the intermediate photomask, has made it desirable to develop initiator systems which can be activated by visible radiation Applications for photopolymerizable compositions which are sensitive to visible radiation include graphic arts films, proofing, printing plates, photoresists, and solder masks. The preparation of holograms in photopolymerizable compositions, such as are disclosed in Haugh, U.S. Pat. No. 3,658,526, Keys, U.S. Pat. No. 5 4,942,102, Monroe, U.S. Pat. No. 4,942,112, Smothers, U.S. Pat. No. 4,959,284 and Trout, U.S. Pat. No. 4,963,471, also require initiator systems which can be activated by visible radiation.

A large number of free-radical generating systems have be used as visible sensitizers for photopolymerizable compositions. Photoreducible dyes and with various coinitiators have been widely studied. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427–487. Many dye sensitized systems undergo dark reactions and are not shelf stable.

Shelf stable initiator systems containing borate anion coinitiators have been disclosed in Gottschalk, U.S. Pat. Nos. 4,772,530 and 4,772,541. The photopolymerizable compositions contained a cationic dye-borate anion complex which is capable of absorbing actinic radiation and producing free radicals. Cationic methine, polymethine, triarylmethane, indoline, thiazine, xanthene, oxazine, and acridine dyes were disclosed. Triarylalkyl borate anions were the preferred borate coinitiators.

Yamaguchi, U.S. Pat. No. 4,902,604, discloses photopolymerizable compositions containing a salt formed by an organic cationic dye compound and a borate anion In these salts the cationic dye compound comprised an azulene ring having a nitrogen atom or a chalcogen atom in the 2- or 4-position.

Koike, U.S. Pat. No. 4,950,581, discloses photopolymerizable compositions containing an organic dye and a triarylbutyl borate anion coinitiator. In these systems the dye did not contain a counter anion. Merocyanine type dyes, coumarin type dyes, and xanthene and thioxanthene dyes were disclosed.

Despite the advances which have been made in visible sensitive photoinitiator systems, there is a continuing need for improved systems which have dark stability, low toxicity, efficient absorption, reasonable cost, and high photospeed.

SUMMARY OF THE INVENTION

This invention is a photopolymerizable Composition comprising:
(A) an ethylenically unsaturated monomer capable of free-radical initiated polymerization; and
(B) an initiator system activatible by actinic radiation, said initiator system comprising:
(1) anionic dye capable of absorbing actinic radiation, and
(2) a borate anion coinitiator represented by the formula:

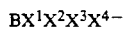

$$BX^1X^2X^3X^4-$$

wherein $X^1$, $X^2$, $X^3$, and $X^4$, the same or different, are selected from the group consisting of alkyl, aryl, aralkyl, alkenyl, alkynyl, alicyclic, heterocyclic, and allyl groups, with the proviso that at least one of $X^1$, $X^2$, $X^3$, and $X^4$ is not aryl.

In a preferred embodiment of this invention the composition also comprises a binder. In another preferred embodiment of this invention the anionic dye is an azo dye or a triarylmethane dye.

DETAILED DESCRIPTION OF THE INVENTION

The novel compositions of this invention are photopolymerizable compositions in which polymerization is initiated by free radicals generated by actinic radiation. Photopolymerization proceeds by free radical initiated addition polymerization and/or crosslinking of ethylenically unsaturated monomeric compounds. These compositions comprise a photoinitiator system, at least one polymerizable monomer, and, in the preferred case, at least one binder. The photoinitiator system comprises (a) an anionic dye and (b) a borate anion coinitiator. These compositions may also comprise other ingredients which are conventional components of photopolymerizable compositions, such as, for example, plasticizers, stabilizers, adhesion promoters, and coating aids.

Photoinitiator System

The photoinitiator system generates the free radicals which initiate polymerization of the monomer or monomers. The photoinitiator system should have a high molar absorption coefficient in the desired absorption range and should generate radicals with high efficiency. In addition, the system should possess such other desirable properties such as dark stability, shelf-life, absence of odor, low toxicity, and reasonable cost.

Gottschalk, U.S. Pat. No. 4,772,530 and U.S. Pat. No. 4,772,541, disclose photoinitiator systems comprising cationic dye-borate anion complexes. In the systems disclosed by Gottschalk the initiator system is said to be a "preformed complex". However, it has been discovered photoinitiator system comprising an anionic dye capable of absorbing actinic radiation and a borate anion coinitiator can be used to initiate photopolymerization.

ANIONIC DYE

The anionic dye comprises one or more negatively charged groups. Typical negatively charged groups are, for example, sulfonate, carboxylate, phenolate, and thiophenolate. Numerous anionic dyes comprising the sulfonate group are known. The preferred anionic dyes are anionic dyes of the triarylmethane and azo classes.

Anionic dyes of the triarylmethane class can be represented by the following general structure:

$$[(Ar^1Ar^2Ar^3C^+)R_n]^{-(n-1)}$$

where $Ar^1$, $Ar^2$, and $Ar^3$, alike or different, are substituted or unsubstituted aryl groups; R is a negatively charged group substituted on $Ar^1$, $Ar^2$, or $Ar^3$, either directly or on a group substituted on $Ar^1$, $Ar^2$, or $Ar^3$; and n is an integer greater than one. R may represent more than one type of group, for example sulfonate and carboxylate, if both are present in the same dye. If the dye contains positively charged groups, a sufficient number of negatively charged groups must be present so that the overall charge on the dye remains negative. Associated with the dye is one or more cations with sufficient charge to balance the charge on the anionic dye.

The aryl groups may be carbocyclic, such as phenyl and naphthyl, or they may be heteroaromatic, such as furanyl, thiophenyl, pyridinyl, pyrazinyl, and the like. The aryl groups may be substituted with the negatively charged groups listed above as well as any of the other groups well known in the art. Such groups include, for example: sulfonate; carboxylate; phenolate; thiophenolate; amino; alkylamino, such as ethylamino; dialkyamino, such as diethylamino; arylamino, such as phenylamino; substituted arylamino, such as ethoxyphenylamino and sulfonated phenylamino; substituted and unsubstituted aryl, such as phenyl, naphthyl, sulfonated phenyl, sulfonated naphthyl, carboxyphenyl, hydroxyphenyl, and thiohydroxyphenyl; alkyl, such as methyl and ethyl; substituted alkyl, such as propyl and butyl groups substituted with sulfonate and/or carboxylate groups; aralkyl, such as benzyl and substituted benzyl; alkoxy, such as ethoxy; substituted and unsubstituted aryoxy, such as phenoxy, sulfonated phenoxy, and dialkylaminophenoxy; formyl; acetyl; carboxymethyl; carboxyethyl; nitro; cyano; halo; and the like.

Anionic dyes of the azo class can be represented by the following general structure:

$$[(Ar^1N=NAr^2)R_n]^{-(n)}$$

where $Ar^1$ and $Ar^2$, alike or different are substituted or unsubstituted aryl groups; R is a negatively charged group substituted on $Ar^1$ or $Ar^2$, either directly or on a group substituted on Arhu 1 or $Ar^2$; and n is an integer. R may represent more than one type of group, for example sulfonate and carboxylate, if both are present in the same dye. If the dye contains positively charged groups, a sufficient number of negatively charged groups must be present so that the overall charge on the dye remains negative. Associated with the dye is one or more cations with sufficient charge to balance the charge on the anionic dye. The aryl groups may be substituted as described above.

More preferred dyes are triarylmethane and azo dyes in which the negatively charged group(s) comprises sulfonate. Preferred azo dyes are Methyl Orange and Ethyl Orange. Preferred triarylmethane dyes are Brilliant Green G, Brilliant Blue R, Lissamine Green B, and Patent Blue VF.

The cation associated with the anionic dye should not absorb a significant portion of the actinic radiation. Cations which form insoluble salts when associated with anionic dyes should not be used. Typical cations associated with anionic dyes are alkali metal cations, such as the sodium ion, and ammonium anions. Alkyl ammonium cations, especially tetraalkylammonium cations, may be used to advantage to increase the solubility of the dye in the coating solvent and/or the photopolymerizable composition. Representative quaternary ammonium cations are tetramethyl ammonium, tetraethyl ammonium, tetrabutyl ammonium, benzyl trimethyl ammonium, benzyl dimethyl tetradecylammonium, and (2-hydroxyethyl)trimethyl ammonium.

Borate Anion

Borate anions useful as coinitiators with dyes are disclosed in Gottschalk, U.S. Pat. Nos. 4,772,530 and 4,772,541 and Koike, U.S. Pat. No. 4,950,581, the disclosures of which are incorporated by reference. The borate anions are represented by the following general formula:

$$BX^1X^2X^3X^4{}^-$$

where $X^1$, $X^2$, $X^3$, and $X^4$, are independently selected from the group consisting of alkyl, aryl, aralkyl, alkenyl, alkynyl, heterocyclic, and allyl groups, with the proviso that at least one of $X^1$, $X^2$, $X^3$, and $X^4$, is not aryl.

Each group may contain up to twenty carbon atoms, but groups with about seven carbon atoms or less are preferred. The alkyl groups may be linear, branched or cyclic, and may be substituted or unsubstituted. Representative alkyl groups which may be present are, for example: methyl, ethyl, n-propyl, i-butyl, secbutyl, n-butyl, n-pentyl, etc. Representative cyclic alkyl groups include cyclobutyl, cyclopentyl, and cyclohexyl.

Representative examples of aralkyl groups are benzyl and benzyl substituted with such groups as, for example, alkyl, alkoxyl, halo, cyano, and other conventional aromatic substituents. Representative examples of aryl groups include phenyl and naphthyl, which may be unsubstituted or substituted with groups such as, for example, alkyl, alkoxyl, halo, cyano, and other conventional aromatic substituents. Representative alkenyl groups are propenyl and ethynyl. Examples of heterocyclic groups include, for example, furanyl, thiophenyl, pyridinyl, and pyrazinyl, unsubstituted or substituted with conventional aromatic substituents.

Preferably, at least one, but not more than three, of $X^1$, $X^2$, $X^3$, and $X^4$ is an alkyl group. More preferred are anins in which $X^1$–$X^4$ is a combination of three aryl groups and one alkyl group. The phenyl and p-methoxyphenyl groups are preferred aryl groups. Even more preferred group of anions are the triphenylalkyl borate anions. The most preferred anion is the triphenylbutyl borate anion.

It is preferred that the cation associated with the borate anion not absorb a significant amount of actinic radiation since this would decrease photospeed. Cations which form insoluble salts when associated with anionic dyes should not be used. Representative cations are alkali metal cations and quaternary ammonium cations.

Quaternary ammonium cations containing four alkyl groups are preferred. The alkyl groups may be linear, branched or cyclic, and may be substituted or unsubstituted. Representative quaternary ammonium cations are tetramethyl ammonium, tetraethyl ammonium, tetrabutyl ammonium, benzyl trimethyl ammonium, benzyl dimethyl tetradecylammonium, and (2-hydroxyethyl)-trimethyl ammonium.

Cations with larger alkyl groups may be used to advantage since the solubility of the borate salt in the coating solvent is generally increased. Cations in which the alkyl groups together contain up to a total about thirty carbon atoms are preferred. Hydroxyl substitution may improve solubility and/or photospeed. Particularly preferred cations are (2-hydroxyethyl)trimethyl ammonium and benzyl dimethyl tetradecyl ammonium.

Monomer/Binder

The composition contains at least one ethylenically unsaturated compound which undergoes free-radical initiated polymerization, generally known as a monomer. The composition contains at least one such material and may contain a mixture of such materials. In general, preferred monomers for photopolymer applications have boiling points greater than 100° C., more preferably, greater than 150° C.

Typical monomers are: unsaturated esters of alcohols, preferably polyols, such as, diethylene glycol diacrylate, glycerol triacrylate, ethylene glycol dimethacrylate, pentaerythritol tri- and tetraacrylate and methacrylate; unsaturated amides, such 1,6-hexamethylene bis-acrylamide; vinyl esters such as divinyl succinate, divinyl phthalate, and divinyl benzene-1,3-disulfonate; styrene and derivatives thereof; and N-vinyl compounds, such as N-vinyl carbazole. Numerous other unsaturated monomers polymerizable by free-radical initiated polymerization and useful in photopolymerizable compositions are known to those skilled in the art. For photoresist applications the preferred monomers are trimethylol propane triacrylate, the triacrylate ester of ethoxylated trimethylolpropane, tetraethylene glycol diacrylate, and tetraethylene glycol dimethacrylate.

The binder is an optional component present in the preferred photopolymerizable compositions of this invention. The binder is a preformed macromolecular polymeric or resinous material. In general, the binder should be soluble, or at least swellable, in the coating solvent and compatible with the other components of the photopolymerizable system. Representative binders are poly(methyl methacrylate) and copolymers of methyl methacrylate with other alkyl acrylates, alkyl methacrylates, methacrylic acid, and/or acrylic acid; poly(vinyl acetate) and its partially hydrolyzed derivatives; gelatin; cellulose esters and ethers, such as cellulose acetate butyrate; and polyethylene oxides. Numerous other binders useful in photopolymerizable compositions are known to those skilled in the art.

Although the borate anion is generally unstable in the presence of strong acid, the use of acidic binders in the practice of this invention is not precluded. It is preferred, however, that the binder contain acid units derived from weakly acidic monomers, such as acrylic acid and methacrylic acid, and/or the binder have a low acid number. For photoresist applications the preferred binders are copolymers of methyl methacrylate, ethyl acrylate, and methacrylic acid. Copolymers of methyl methacrylate, ethyl acrylate, and methacrylic acid copolymerized with a small amount of allyl methacrylate may also be used to advantage.

As disclosed in Keys, U.S. Pat. No. 4,942,102, Monroe, U.S. Pat. No. 4,942,112, Smothers, U.S. Pat. No. 4,959,284 and Trout, U.S. Pat. No. 4,963,471, in the preferred compositions adapted for the preparation of holograms either the monomer or the binder contains one or more moieties selected from the group consisting of (1) an aromatic moiety selected from the group consisting of (i) substituted or unsubstituted phenyl, (ii) substituted or unsubstituted naphthyl, and (iii) substituted or unsubstituted heterocyclic aromatic moiety having up to three rings; (2) chlorine; (3) bromine and mixtures thereof; and the other constituent is substantially free of said moiety.

For systems in which the monomer contains the indicated group and the binder is free of the indicated group preferred liquid monomers are: 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, p-biphenyl methacrylate, p-biphenyl acrylate, and mixtures thereof. Preferred solid monomers, which may be used in combination with liquid monomers are: N-vinyl carbazole; 2,4,6-tribromophenyl acrylate or methacrylate; pentachlorophenyl acrylate or methacrylate; 2-naphthyl acrylate or methacrylate; 2-(2-naphthyloxy)ethyl acrylate or methacrylate; and mixtures thereof. Preferred binders for use in these systems are: cellulose acetate butyrate; poly(methyl methacrylate); poly(vinyl butyral); poly(vinyl acetate); and fluorine containing binders containing 3 to 25% by weight fluorine, such as copolymers of vinyl acetate with tetrafluoroethylene and/or hexafluoropropylene. For reflection holograms, the preferred binders are poly(vinyl butyral), poly(vinyl acetate), and copolymers of vinyl acetate with tetrafluoroethylene and/or hexafluoropropylene containing 3 to 25% by weight fluorine, such the 82:18 (mole %) vinyl acetate/tetrafluoroethylene copolymer.

For systems in which the binder contains the indicated group and the monomer is free of the indicated group, preferred monomers are: triethyleneglycol diacrylate and dimethacrylate, diethyleneglycol diacrylate, decanediol diacrylate, ethoxyethoxyethyl acrylate, and iso-bornyl acrylate. Preferred binders for these systems are: polystyrene and copolymers containing at least about 60% styrene. Particularly preferred binders include polystyrene, 75:25 poly(styrene/acrylonitrile), and 70:30 poly(styrene/methyl methacrylate), as well as mixtures thereof.

If crosslinking of the holographic photopolymer is desired, up to about five weight percent of at least one multifunctional monomer containing two or more terminal ethylenically unsaturated groups may be incorporated into the composition. The polyfunctional monomer must be compatible with the other components of the composition and is preferably a liquid. Suitable polyfunctional monomers include di-(2-acryloxyethyl)ether of bisphenol A, ethoxylated bisphenol A diacrylate, and the like. A preferred crosslinking is ethoxylated bisphenol A diacrylate.

Other Components

Other components conventionally added to photopolymerizable compositions can be present to modify the physical properties of the film. Such components include: plasticizers, thermal stabilizers, optical brighteners, ultraviolet radiation absorbing materials, adhesion modifiers, coating aids, and release agents.

A plasticizer may be present to modify adhesion, flexibility, hardness, and other mechanical properties of the film in a conventional fashion. When a binder is present, a plasticizer would be selected which is compatible with the binder as well as the monomer and other components of the composition. With acrylic binders, for example, plasticizers can include dibutyl phthalate and other esters of aromatic acids; esters of aliphatic polyacids, such as diisooctyl adipate; aromatic or aliphatic acid esters of glycols, polyoxyalkylene glycols, aliphatic polyols; alkyl and aryl phosphates; and chlorinated paraffins. In general, water insoluble plasticizers are preferred for greater high humidity storage stability, but are not necessary to get improved latitude.

Many ethylenically unsaturated monomers are subject to thermal polymerization, especially when stored for long periods or at elevated temperatures. Normally a conventional thermal polymerization inhibitor will be present to improve the storage stability the photopolymerizable composition. The nitroso dimers described in Pazos, U.S. Pat. No. 4,168,982, are also useful. Since monomers generally contain thermal polymerization inhibitors added by their manufacturers, it is frequently unnecessary to add additional inhibitor.

Nonionic surfactants may be added to the photopolymerizable composition as coating aids. Typical coating aids are polyethylene oxides, such as Polyox® WSRN, and fluorinated nonionic surfactants, such as Fluorad® FC-430 and Fluorad® FC-431.

Depending on the application, other inert additives can be employed such as dyes, pigments and fillers. These additives are generally present in minor amounts so as not to interfere with the exposure of the photopolymerizable layer.

Composition

While the composition of the photopolymerizable composition will depend on the intended application, when the composition is to be used as a dry film, in general, the binder should be at least about 25% and the monomer should not exceed about 60%, based on the total weight of the composition. If the amount of binder is below approximately 25%, or the amount of monomer exceeds approximately 60%, the composition has insufficient viscosity to form a solid film. While the amount of initiator system present will depend on the thickness of the layer and the desired optical density for the intended application, in general, about 0.1% to about 10% will be present.

Typical compositions are: binder(s) 25 to 90%, preferably 45 to 75%; monomer(s), 5 to 60%, preferably, 15 to 50%; plasticizer, 0 to 25%, preferably, 0 to 15%; photoinitiator system, 0.05 to 10%, preferably 0.1 to 5%; and other ingredients, 0 to 5%, typically 0 to 4%.

The amount of dye present depends on the wavelength(s) of actinic radiation used for exposure, the absorption spectrum of the dye, and the thickness of the photopolymer coating. As described by Thommes and Webers, *J. Imag. Sci.* 29, 112 (1985), an optical density of 0.43 produces efficient photopolymerization for systems which are developed by washout, such as photoresists. It is generally preferred that the absorption maximum of the dye be matched to the intensity maximum of the source of actinic radiation. In general the dye will comprise about 0.05 to about 1.0% preferably about 0.1 to about 0.5% of the composition.

The amount of borate salt present is limited by its solubility. Although as much as 1% or more borate salt may be added in favorable cases, addition of too much borate salt may adversely affect the dark stability and shelf life of the photopolymer. In general, the concentration of borate salt should be between about 0.05 and about 1%. A preferred range is about 0.1 to about 1.0%.

Substrates/Coating

The photopolymerizable compositions can be coated onto a wide variety of substrates. By "substrate" is meant any natural or synthetic support, preferable one which is capable of existing in a flexible or rigid form. For example, the substrate can be a metal sheet or foil, a sheet or film of synthetic organic resin, cellulose paper, fiberboard, and the like, or a composite of two or more of these materials.

The particular substrate will generally be determined by the intended application. For example, when printed circuits are produced, the substrate may be a plate which is a copper coating on fiberboard; in the preparation of of lithographic printing plates, the substrate may be anodized aluminum. Specific substrates include alumina-blasted aluminum, anodized aluminum, alumina-blasted polyethylene terephthalate film, polyethylene terephthalate film, e.g., resin-subbed polyethylene terephthalate film, polyvinyl alcohol-coated paper, crosslinked polyester-coated paper, nylon, glass, cellulose acetate film, heavy paper such as lithographic paper, and the like.

The photopolymerizable layer may prepared by mixing the ingredients of the photopolymerizable composition in a solvent, such as dichloromethane, usually in the weight ratio of about 15:85 to 25:75 (solids to solvent), coating on the substrate, and evaporating the solvent. Coatings should be uniform. While the thickness of the layer will depend on the intended application, for dry film photoresists the coating should should have a thickness of about 0.2 to 4 mil (5 to 100 microns), preferably 0.5 to 2 mil (13 to 50 microns), when dry. For protection, a release film, such as polyethylene or polypropylene, may be placed over the photopolymerizable layer after the solvent evaporates.

Alternatively, since photopolymer compositions are quickly and efficiently coated onto polymer films using continuous web coating techniques, it may be convenient to coat the photopolymerizable composition onto a polymer film support, such as polyethylene terephthalate film, and laminate the resulting photopolymerizable layer to the substrate prior to exposure. The photopolymerizable layer may be protected until it is ready for use by, preferably, a release film, such as polyethylene or polypropylene, applied as the coated polymer film emerges from the drier. After removal of the release film, the photopolymerizable layer can then be laminated to the support. The polymer film support then acts as a coversheet which is removed after exposure.

Exposure/Image Formation

Any convenient source or sources of actinic radiation providing wavelengths in the region of the spectrum that overlap the absorption bands of the sensitizer can be used to activate photopolymerization. By "actinic radiation" is meant radiation which is active to produce the free-radicals necessary to initiate polymerization of the monomer(s). The radiation can be natural or artificial, monochromatic or polychromatic, incoherent or coherent, and for high efficiency should correspond closely to in wavelength to the absorption of the initiator system. Conventional light sources include fluorescent lamps, mercury, metal additive and arc lamps. Coherent light sources are xenon, argon ion, and ionized neon lasers, as well as tunable dye lasers and the frequency doubled neodymium:YAG laser, whose emissions fall within or overlap the visible absorption bands of the sensitizer.

For the exposure of holographic photopolymer systems coherent light sources, i.e., lasers, are required. Typically ion lasers, which have the required stability and coherence length but operate at a few lines of fixed wavelength, are used. With the development of photopolymer films that are sensitized across the visible spectrum, tunable lasers are required to match the broad spectral sensitivity of these materials. Since it often desirable to record the hologram or holographic optical element (i.e., a hologram which acts as a diffraction grating, a mirror, a lens, or a combination of optical elements) with the same wavelength actinic radiation which will be used for reconstruction, tunable lasers offer added flexibility of recording a hologram and making a holographic optical element at any desired wavelength or at more than one selected wavelength.

Many wavelength tunable laser sources are now practical and can be used for holography. One type of tunable laser, the dye laser, can operate at any wavelength from the ultraviolet to the infra-red by the proper choice of pump source and dye medium. Dye laser systems can be pulsed with pulses of light as short as a few femtoseconds or can operate in the continuous wave mode. Continuous wave dye lasers with linear and ring cavity configurations can be pumped by other lasers, for example argon and krypton ion lasers, resulting in high average power. The bandwidth of the dye lasers can be narrowed with the use of intracavity etalons resulting in long coherence lengths. Advantages of these laser systems are the added control of wavelength and coherence length.

In the preparation of holograms from the compositions of this invention, the hologram is fixed by a second, overall exposure to actinic radiation. If the hologram is a reflection hologram and the binder is poly(vinyl butyral), poly(vinyl acetate), or a copolymer of vinyl acetate with tetrafluoroethylene and/or hexafluoropropylene containing 3 to 25% by weight fluorine, the refractive index modulation of the hologram can be enhanced by heating to 100°–150° C. for about 0.5–1.5 hour following overall exposure.

The photopolymerizable compositions of this invention show good visible light sensitization and photospeed They may be exposed with a variety of visible light sources. The broad sensitization range enables polymeric images, which may be further processed by development to produce resist images, or other relief images, to be formed. These compositions are useful in printing plates for offset and letter press, engineering drafting films, as well as photoresists in liquid or dry film form for making printed circuits or in solder masks. The resist can be either solvent soluble or aqueous developable. Solder masks are protective coatings which are selectively applied to portions of a printed circuit board to confine solder to pad areas on the board and to prevent bridging between conductors during tinning operations and during soldering of components. A solder mask also functions to prevent or minimize corrosion of the base copper conductors and as a dielectric to insulate certain components in adjacent circuitry.

The compositions of this invention are useful for the formation of holograms in which sensitivity to visible lasers is required. One or more of the dyes of this invention may be combined with each other, with other dyes which can be used in combination with borate anions, and/or with other initiator systems to produce photopolymerizable compositions with broad spectral sensitivity. Multiple holograms, generated by holographic exposure with actinic radiation of different wavelengths, can be prepared in these materials. These holograms are particularly useful in the preparation of multicolor display holograms. They can also be used as holographic notch filters when it is desired to protect against more than one wavelength of radiation.

Other specific uses for the compositions of this invention and for the holograms and multicolor holograms prepared therefrom will be evident to those skilled in the art.

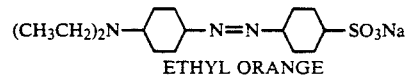

ETHYL ORANGE

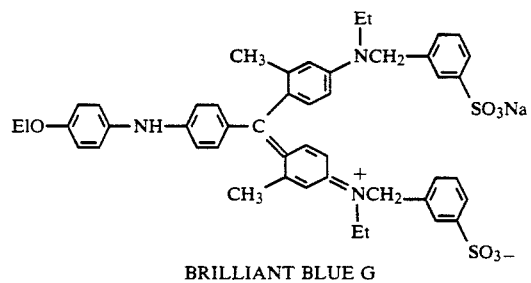

BRILLIANT BLUE G

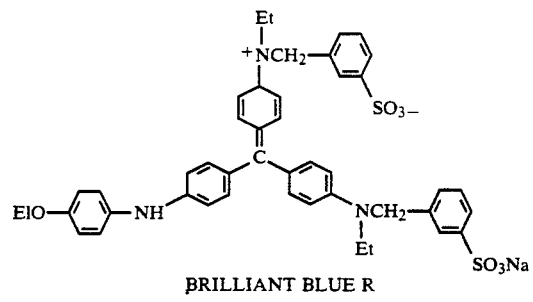

BRILLIANT BLUE R

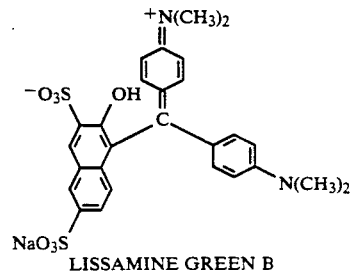

LISSAMINE GREEN B

-continued

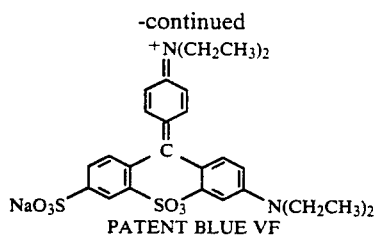
PATENT BLUE VF

The advantageous properties of this invention can be observed by reference to the following examples which illustrate, but do not limit, the invention.

EXAMPLES
GLOSSARY

| | |
|---|---|
| Brilliant Blue G | Acid Blue 90; C.I. 42655; CAS 6104-58-1 |
| Brilliant Blue R | Acid Blue 83; C.I. 42660; CAS 6104-59-2 |
| Carboset ® 1034 | Poly(methyl methacrylate/ethyl acrylate/methacrylic acid) (44/35/21); MW 50,000; Tg 87° C.; Union Carbide, Danbury, CT |
| Ethyl Orange | 4-(4-Diethylaminophenyl-azo)benzenesulfonicacid, sodium salt; CAS 62758-12-7 |
| Lissamine Green B | Acid Green 50; C.I. 44090; CAS 3087-16-9 |
| Patent Blue VF | Acid Blue 1; C.I. 42045; CAS 129-17-9 |
| TMAB | Tetramethylammonium triphenylbutyl borate |
| TMPEOTA | Triacrylate ester of ethoxylated trimethylolpropane; CAS 28961-43-5 |
| TMPTA | Trimethylolpropane triacrylate; 2-ethyl-2-(hydroxymethyl)-1,3-propanediol triacrylate; CAS 15625-89-5 |

In the Examples which follow it should be understood that "coating solution" refers to the mixture of solvent and additives which is coated, even though some of the additives may be in suspension rather than in solution, and that "total solids" refers to the total amount of nonvolatile material in the coating solution even though some of the additives may be nonvolatile liquids at ambient temperature.

EXAMPLE 1

All operations were carried out under yellow lights. A stock solution containing Carboset ® 1034 (65.0%), TMPEOTA (26.0%), and TMPTA (9.0%) was prepared by dissolving the ingredients in the coating solvent (54.5% total solids). The indicated initiators were added to aliquots of the stock solution prior to coating. The indicated percentage of added initiator is the weight of added initiator in grams relative to 100 g of solids in the stock solution.

Solutions were board coated on 23 micron thick clear polyethylene terephthalate film with a 200 micron doctor blade to give a dry film thickness of approximately 38 microns. The coating solvent was either 2-butanone with about 8% methanol and 5% water added to increase the solubility of some ingredients or 2-butanone with 5% 1- or 2-propanol added.

Films were hot roll laminated to copper, exposed under a Stouffer-41 target (Stouffer Industries, South Bend, Ind.) using a PC-130 printer (Du Pont, Wilmington, Del.). The polyethylene terephthalate was left in place as a coversheet during exposure. The Stouffer-41 target contains forty one sixth root of two steps. The polyethylene terephthalate film was removed and the exposed samples developed at 50% breakpoint (29° C., 1% aqueous sodium carbonate) using a Chemcut aqueous processor (Chemcut, State College, Pa.). All exposed films which were capable of holding steps were also capable of imaging at least an about 250 micron line pattern. Those exposed films which were incapable of holding steps were also incapable of holding a line and space pattern. The results are shown in Table 1.

TABLE 1

| Initiator Systems[c] | Exposure (mJ/cm$^2$) | $(2)^{1/6}$ Steps | | Relative Photo-speed[c] |
|---|---|---|---|---|
| | | No Borate | Borate[b] | |
| None | 1620 | 0 | 0 | d |
| Ethyl Orange | 1604 | 0 | 18 | e |
| Brilliant Blue G | 1750 | 0 | 19 | " |
| Brilliant Blue R | 1750 | 0 | 19 | " |
| Lissamine Green B | 1750 | 0 | 37 | f |
| Patent Blue VF | 1750 | 0 | 36 | " |

[a]0.25% of dye added
[b]0.12% Tetramethyl ammonium triphenylbutyl borate (TMAB) added to Ethyl Orange. 0.12% (2-Hydroxyethyl)trimethylammonium triphenylbutyl borate (HTMAP) added to other dyes.
[c]Photospeed of composition with borate added relative to the same composition without borate.
[d]Control - no photopolymerization with or without added borate.
[e]Not calculable - greater than 8.0.
[f]Not calculable - greater than 60.

Having described the invention, we now claim the following and their equivalents.

What is claimed is:

1. A photopolymerizable composition comprising:
   (A) an ethylenically unsaturated monomer capable of free-radical initiated polymerization; and
   (B) an initiator system activatible by actinic radiation, said initiator system comprising:
   (1) an anionic dye capable of absorbing actinic radiation, and
   (2) a borate salt containing (a) an alkali metal cation or a quaternary ammonium cation and (b) a borate anion coinitiator represented by the formula:

$BX_1X_2X_3X_4^-$ wherein $X_1$, $X_2$, $X_3$, And $X_4$, the same or different, are selected from the group consisting of alkyl, aryl, aralkyl, alkenyl, alkynyl, alicyclic, heterocyclic, and allyl groups, with the proviso that at least one of $X_1$, $X_2$, $X_3$, and $X_4$ is not aryl.

2. The composition of claim 1 wherein said anionic dye comprises one or more negatively charged groups selected from the group consisting of sulfonate, carboxylate, phenolate, and thiophenolate.

3. The composition of claim 1 wherein said anionic dye is an anionic triarylmethane dye or an anionic azo dye.

4. The composition of claim 3 wherein said anionic dye is selected from the group consisting of Methyl Orange, Ethyl Orange, Brilliant Green G, Brilliant Blue R, Lissamine Green B, and Patent Blue VF.

5. The composition of claim 1 wherein said $X^1$–$X^4$ is a combination of three aryl groups and one alkyl group.

6. The composition of claim 1 additionally comprising a binder.

7. The composition of claim 6 wherein said anionic dye comprises one or more negatively charged groups selected from the group consisting of sulfonate, carboxylate, phenolate, and thiophenolate.

8. The composition of claim 6 wherein said $X^1$–$X^4$ is a combination of three aryl groups and one alkyl group.

9. The composition of claim 6 wherein said anionic dye is an anionic triarylmethane dye or an anionic azo dye.

10. The composition of claim 9 wherein $X^1$–$X^4$ is a combination of three aryl groups and one alkyl group and each aryl group is phenyl or p-methoxyphenyl.

11. The composition of claim 9 wherein said anionic dye is selected from the group consisting of Methyl Orange, Ethyl Orange, Brilliant Green G, Brilliant Blue R, Lissamine Green B, and Patent Blue VF.

12. In process for forming a photopolymer image by irradiating a composition comprising an ethylenically unsaturated monomer capable of free-radical initiated polymerization and a binder, wherein the improvement comprises:
   an initiator system activatible by actinic radiation,
   said initiator system comprising:
   (A) an anionic dye capable of absorbing actinic radiation, and
   (B) a borate salt containing (a) an alkali metal cation or a quaternary ammonium cation and (b) a borate anion coinitiator represented by the formula:

$$BX_1X_2X_3X_4^-$$

wherein $X_1$, $X_2$, $X_3$, And $X_4$, the same or different, are selected from the group consisting of alkyl, aryl, aralkyl, alkenyl, alkynyl, alicyclic, heterocyclic, and allyl groups, with the proviso that at least one of $X_1$, $X_2$, $X_3$, and $X_4$ is not aryl.

13. The process of claim 12 wherein said image is a hologram.

14. The process of claim 12 wherein said image is a photoresist image.

15. The process of claim 12 wherein said $X^1$–$X^4$ is a combination of three aryl groups and one alkyl group.

16. The process of claim 12 wherein said anionic dye is an anionic triarylmethane dye or an anionic azo dye.

17. The process of claim 16 wherein $X^1$–$X^4$ is a combination of three aryl groups and one alkyl group and each aryl group is phenyl or p-methoxyphenyl.

18. The process of claim 16 wherein said image is a hologram.

19. The process of claim 16 wherein said image is a photoresist image.

20. The process of claim 16 wherein said anionic dye is selected from the group consisting of Methyl Orange, Ethyl Orange, Brilliant Green G, Brilliant Blue R, Lissamine Green B, and Patent Blue VF.

* * * * *